United States Patent [19]

Sasaki

[11] Patent Number: 5,081,058

[45] Date of Patent: Jan. 14, 1992

[54] METHOD OF MANUFACTURING AN INSULATED GATE FIELD EFFECT TRANSISTOR ALLOWING PRECISE CONTROL OF OPERATING CHARACTERISTICS

[75] Inventor: Masakazu Sasaki, Tokyo, Japan

[73] Assignee: NEC Corporation, Tokyo, Japan

[21] Appl. No.: 642,027

[22] Filed: Jan. 16, 1991

Related U.S. Application Data

[63] Continuation of Ser. No. 285,200, Dec. 16, 1988, abandoned.

[51] Int. Cl.⁵ .......................................... H01L 21/336
[52] U.S. Cl. .......................................... 437/44; 437/69; 437/70; 437/72
[58] Field of Search .................... 437/69, 70, 72, 44

[56] References Cited

U.S. PATENT DOCUMENTS 4,216,573  8/1980  Joshe et al. .......................... 437/44
4,326,329  4/1982  McElroy .............................. 437/70
4,551,910  11/1985  Patterson ...................... 148/DIG. 117
4,758,530  7/1988  Schubert ............................. 437/69

FOREIGN PATENT DOCUMENTS 63-221640  9/1988  Japan ................................... 437/69
63-248134  10/1988  Japan ................................... 437/69

Primary Examiner—Olik Chaudhuri
Assistant Examiner—G. Fourson
Attorney, Agent, or Firm—Helfgott & Karas

[57] ABSTRACT

An insulated gate field effect transistor surrounded by a field silicon oxide layer which is at least partially embedded in a silicon substrate, is disclosed. A pair of silicon oxide layers thinner than the field silicon oxide layer and thicker than the gate insulating film are formed on both end portions of the channel region in the channel width direction, and the gate electrode is formed on the gate insulating film and extends on the pair of silicon oxide layers and on the field silicon oxide layer.

8 Claims, 6 Drawing Sheets

5,081,058

METHOD OF MANUFACTURING AN INSULATED GATE FIELD EFFECT TRANSISTOR ALLOWING PRECISE CONTROL OF OPERATING CHARACTERISTICS

This is a continuation of application Ser. No. 285,200, filed Dec. 16, 1988 now abandoned.

BACKGROUND OF THE INVENTION

The present invention relates to an insulated gate field effect transistor (hereinafter abbreviated to IGFET), and more particularly to an IC using a complementary type IGFET's (hereinafter abbreviated to CMOS) or to an IC using a bipolar and a CMOS (hereinafter abbreviated to BiCMOS).

The CMOS and the BiCMOS have been widely used in IC's, because the former has a low power consumption characteristic and the latter has a good high frequency and a low power consumption characteristics. Both IC's employ an N-channel type IGFET formed in a P-type substrate region, that is, a P-well, and a P-channel type IGFET formed in an N-type substrate region, and these N-type and P-type IGFET's are separated from each other by interposing an isolation region therebetween. The isolation region is made of a thick silicon oxide layer formed by thermal oxidation of a silicon substrate under a high temperature during a long time. In this case, at portions of the channel region of the IGFET abutted against the thick silicon oxide layer, a designed threshold voltage cannot be obtained, because impurities in both end portions of the channel region in the channel width direction abutted against the thick field silicon oxide layer migrate into the thick field silicon oxide layer and the impurity concentration at the end portions fall unfavorably to a low level. Particularly, borons are more apt to migrate, and the degree of the change in the boron concentration at the end portions of the channel region is largely deviated by the process conditions. Therefore, the problem is more serious in an N-channel type IGFET formed in a P-well doped with borons as the impurity. Consequently, in a prior art, a precise control of the characteristics of the IGFET or the IC using the IGFET is impossible.

SUMMARY OF THE INVENTION

Accordingly, it is an object of the present invention to provide an IGFET in which the adverse effect from the field silicon oxide layer is eliminated, and a precise control for the characteristics can be realized.

According to a feature of the present invention, there is provided an IGFET which comprises a silicon substrate having a major surface, a transistor region formed in the substrate, a field silicon oxide layer formed by thermally converting silicon in the substrate so as to be embedded inwardly in the substrate at its major surface, the field oxide layer having a sizeable thickness and surrounding substantially the transistor region, source and drain regions of the transistor formed in the transistor region, a channel region of the transistor positioned in the transistor region between the source and drain regions, the channel region having first, second, third and fourth edge lines, the first and second edge lines being abutted against the source and drain regions, respectively, the third and fourth edge lines facing the field oxide layer, respectively, a gate insulating film of the transistor formed on the channel region, first and second intermediate oxide layers formed between and abutted against the field oxide layer and the third and fourth edge lines of the channel region, respectively, each of the first and second intermediate oxide layers having a thickness thinner than the field oxide layer and thicker than the gate insulating film and having a belt-like or a rectangular plan shape, and a gate electrode of the transistor formed on the gate insulating film and extending on the first and second intermediate oxide layers and on the field oxide layer. The channel region may be of P conductivity type, and the transistor may be a N-channel type transistor. Generally, the surface of the transistor forming region of the substrate and the upper surface of the field oxide layer are substantially co-planar with each other. Each of the first and second intermediate oxide layers may extend with a constant width along both sides of the source and drain regions, respectively. Or else, the first and second intermediate oxide layers may be continuously formed such that they constitute a ring-like plan shape with a constant width surrounding the periphery of the IGFET region of the substrate attached to and provided between the periphery and the field oxide layer. The IGFET can be manufactured by forming selectively the field oxide layer by a heat treatment under an oxidizing atmosphere at a portion of a silicon substrate outside a transistor forming region including a channel forming region of the substrate, and thereafter forming a silicon oxide layer as the intermediate oxide layer at a portion of the substrate abutted against the field oxide layer and against the channel forming region.

BRIEF DESCRIPTION OF THE DRAWINGS

FIG. 3 to FIG. 14 are drawings showing process steps for manufacturing the first embodiment, in sequence; FIGS. 3 to 7 and 11 to 14 are cross-sectional views; FIGS. 9 and 10 are cross-sectional views showing process steps as viewed in the same direction as FIG. 8B; FIG. 15 is a cross-sectional view and FIGS. 16 and 17 are plan-views.

DESCRIPTION OF A PRIOR ART

Figure 1A:
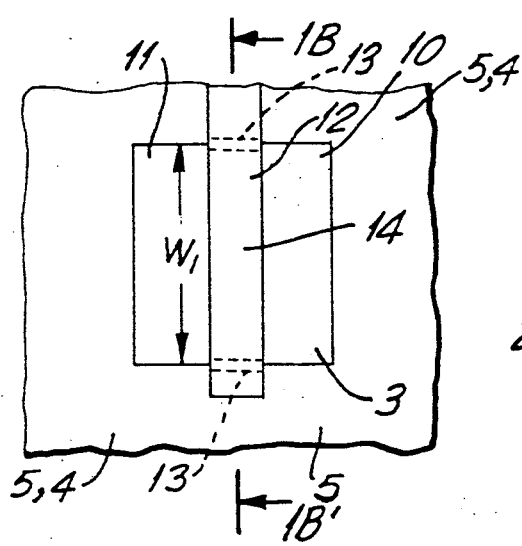
FIG. 1A is a plan view showing an IGFET in a prior art.
Figure 1B:
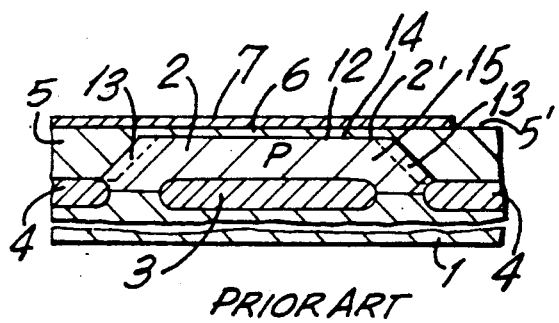
FIG. 1B is a cross-sectional view taken along line B—B' in FIG. 1A as viewed in the direction of arrows.

Referring to FIGS. 1A and 1B, an N-channel type IGFET of a CMOS in a prior art is disclosed. A silicon substrate is constituted by a P-type silicon body 1 and a silicon epitaxial layer 2 formed on the silicon body. In the silicon epitaxial layer 2, a P-type impurity region, that is, a P-well 15 is formed by doping borons. The P-well region 15, in which the N-channel type IGFET is provided, is surrounded by a thick field silicon oxide layer 5 and a P+-type channel stopper region 4 provided under the layer 5. A P+-type buried layer 3 is positioned between the P-type silicon body 1 and the P-well region 15, and N-type source and drain regions 10, 11 are formed. On a channel region 12 between the N-type source and drain regions 10, 11, a silicon gate electrode 7 is formed via a gate insulating film 6 of 20 nm (nanometers) (200 Å) thickness. When the surface impurity (boron) concentration of the P-well region 15 is $2 \times 10^{16}$ cm$^{-3}$, the center portion 14, that is, the major portion of the channel region 12 has also the surface impurity concentration of $2 \times 10^{16}$ cm$^{-3}$ and the threshold voltage thereof becomes, for example, 0.8 volts. Therefore, the IC is designed as the threshold voltage of the N-channel type IGFET to be 0.8 volts with a predetermined width $W_1$, for example, of 20 $\mu$m (micrometers). However, at the end portions 13 of the channel region 12 in the channel width direction contacted to the thick field silicon oxide layer 5, the impurity (boron) concentration at the upper surface thereof is inevitably decreased, for example, to 5 to $10 \times 10^{15}$ cm$^{-3}$ during the process steps for forming the silicon oxide layer 5. Therefore, the threshold voltage at these portions becomes from 0 to 0.4 volts. The degree of the change of the boron concentrations at the end portions 13 is largely deviated by the process conditions. Further, if the upper surface 5' of the field silicon oxide layer 5 is to be substantially flat with the major surface 2' of the epitaxial layer 2, that is, of the substrate, in which the IGFET is formed, or with the upper surface of the gate insulating film 6 as shown in FIG. 1B, twice the thermal oxidation process steps are necessary during the long time for forming the field silicon oxide layer 5. In this case, the problem is more serious.

DETAILED DESCRIPTION OF EMBODIMENTS

Referring to FIGS. 2A to 2D, a first embodiment of the present invention will be explained. In FIGS. 2A to 2D, the same components as those in FIGS. 1A and FIG. 1B are indicated by the same reference numerals. According to the present invention, on the unfavorable end portions 13 of the channel region 12, stripe type or belt-like or rectangular plan shaped intermediate silicon oxide layers 18 are formed. Each of the intermediate layers 18 has the width $W_3$ of 0.8 $\mu$m and the thickness of 400 nm (nanometers) (4000 Å) and is embedded into the silicon epitaxial layer 2 from the major surface 2'. By the layers 18, the threshold voltage at the portions 13 becomes such a sufficiently high level that an operation as IGFET is not conducted. That is, the end portions 13 do not operate as a part of the channel region under the normal signal voltage which is applied to gate electrode 7, and the threshold voltage, of the IGFET is defined only by the center or major portion 14 with the constant width $W_2$, for example, of 20 $\mu$m. Consequently, a control of characteristics of the IGFET or of the CMOS using the IGFET can be possible. If the thickness of the intermediate silicon oxide layer 18 were to be far thicker, an unfavorable region same as the region 13 is newly formed inside the intermediate layer 18 at the center portion 14, and if the thickness was to be far thinner, the surface of the region 13 would conduct unfavorably as a part of the channel region. Practically, the thickness of the intermediate silicon oxide layer 18 favorably ranges from 200 nm (nanometers) to 600 nm (2000 Å to 6000 Å). On the other hand, the intermediate layer 18 must cover the region 13, and the integration density of the device must be considered. Therefore, the width $W_3$ of the intermediate layer 18 ranging from 0.4 $\mu$m to 1.5 $\mu$m is favorable.

Figure 2A:
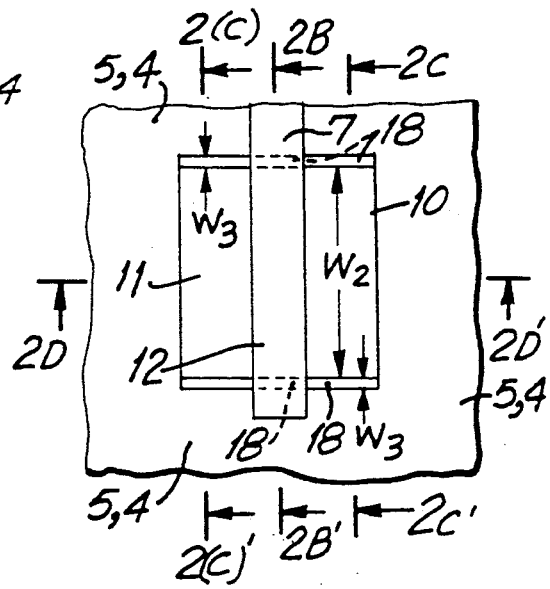
FIG. 2A is a plan view showing a first embodiment of the present invention.
Figure 2B:
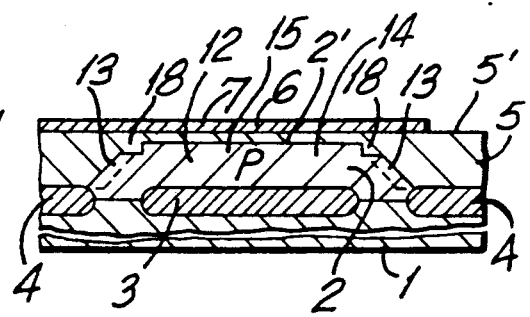
FIGS. 2B, 2C and 2D are cross-sectional views taken along lines B—B', C—C' and D D' in FIG. 2A as viewed in the direction of arrows, respectively.
Figure 2C:
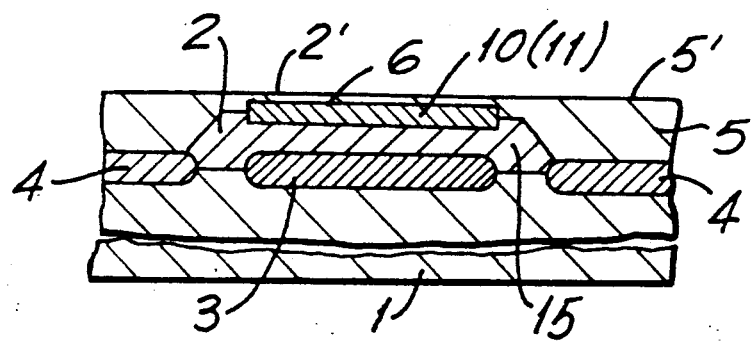
Figure 2D:
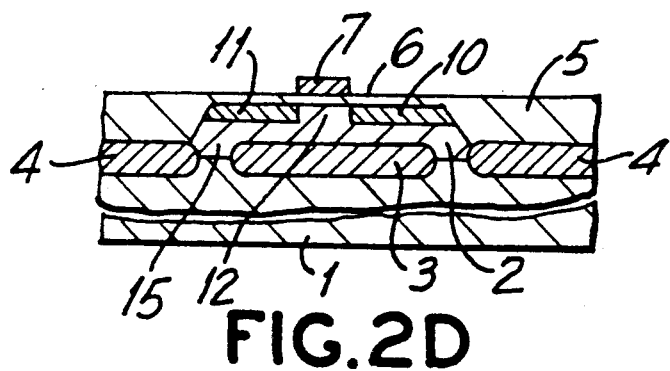

Referring to FIGS. 3 to 14, manufacturing process steps for forming the structure shown in FIGS. 2A, 2B is explained.

Figure 3:
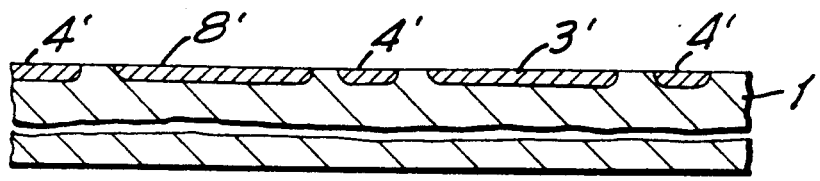
Figure 4:
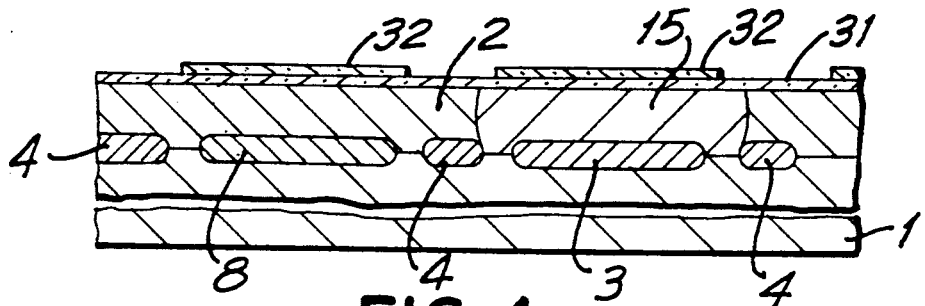
Figure 5:
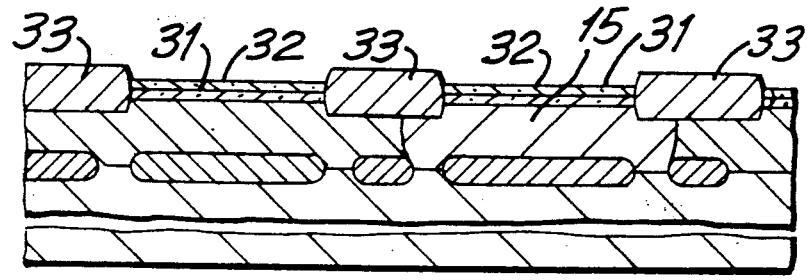
Figure 6:
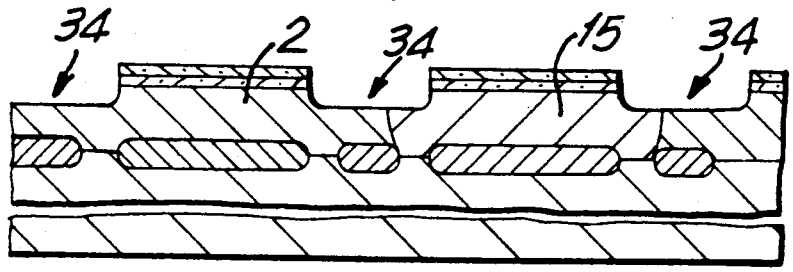
Figure 7:
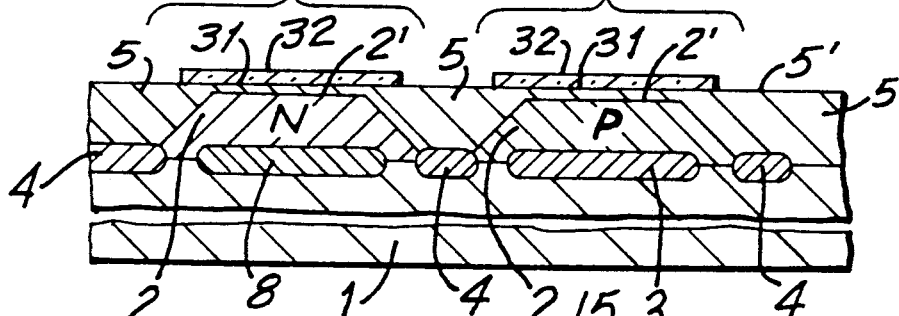

At first, P$^+$-type regions 4', 3' and an N$^+$-type region 8' are selectively formed in the surface of the silicon body 1 (FIG. 3). Next, an epitaxial layer 2 is formed entirely, and the P-well region 15 is formed in the epitaxial layer by introducing borons therein. The deposited epitaxial silicon layer contains N-type impurities. Therefore, the regions of the epitaxial layer except the P-well regions are N-type epitaxial regions, and a P-channel IGFET is formed in the N-type epitaxial region. During the formation of the epitaxial layer, impurities in the P$^+$- and N$^+$-type regions 4', 3' and 8' are diffused upwardly into the epitaxial layer so that the P$^+$-type channel stopper region 4, the P$^+$-type buried region 3 and the N$^+$-type buried region 8 are formed, respectively. Then, a thin silicon oxide film 31 is entirely formed on the surface of the epitaxial layer including the P-well region, and silicon nitride films 32 are selectively formed on the silicon oxide film 31 (FIG. 4). Next, a first oxidation is conducted to form a first thick silicon oxide layer 33 of 1.2 $\mu$m thickness using the silicon nitride films 32 as a mask under oxidizing atmosphere (O$_2$ or steam) of 5 atm ($5 \times 1.33 \times 10^5$ Pascal) at 950° C. during 2 hours. The first thick oxide layer 33 is partially embedded in the epitaxial silicon layer but does not reach to the P$^+$- and N$^+$-type regions 4, 3, 8 (FIG. 5). Next, the thick silicon oxide layer 33 is removed by using the silicon nitride films 32 as a mask so that a groove 34 is formed in the epitaxial silicon layer (FIG. 6). Thereafter, if necessary, another silicon nitride film may be entirely deposited and may be subjected to an anisotropic etching to remain at upper sides of the groove to enforce the silicon nitride film 32 for a subsequent second oxidation. Next, the second oxidation is conducted to form a second thick silicon oxide layer, that is, the thick field silicon oxide layer 5 by using the silicon nitride films 32 as a mask under oxidizing atmosphere (O$_2$ or steam) of 5 atm ($5 \times 1.33 \times 10^5$ Pascal) at 950° C. during 2 hours. The thick field silicon oxide layer 5 has the thickness of 1.2 $\mu$m with the upper surface 5' which is substantially co-planar with the surface 2' of the N-channel and P-channel forming regions. Further, field silicon oxide layer 5 reaches the P$^+$-type channel stopper region 4 and surrounds the transistor forming regions, respectively (FIG. 7). The first and second oxidations (FIGS. 5 and 7) are conducted under the high pressure atmosphere (5 atm), and therefore, a relatively low temperature such as 950° C. may be used. Consequently, the P$^+$-type channel stopper regions 3 are not diffused up to the upper surface of the epitaxial silicon layer along the silicon oxide layer 5 by the oxidations, as shown in FIG. 7. Next, as shown in FIGS. 8A and 8B, a photoresist film 35 is formed on the silicon nitride films 32 to expose the end sections 32' of the films 32.

Figure 8A:
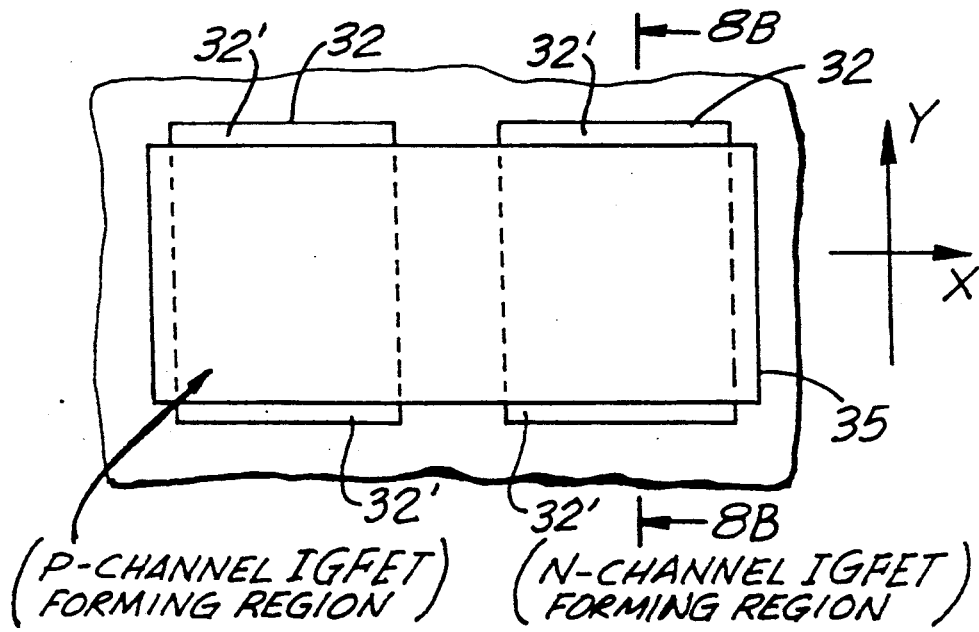
FIG. 8A is a plan view.
Figure 8B:
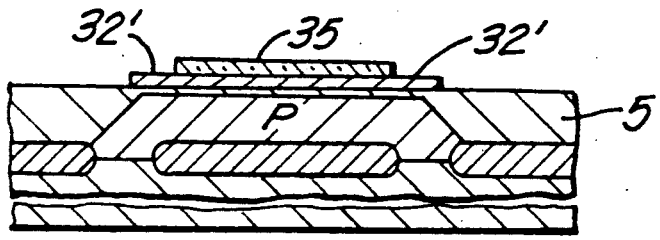
FIG. 8B is a cross-sectional view taken along lines B—B' in FIG. 8A as viewed in the direction of arrows.
Figure 9:
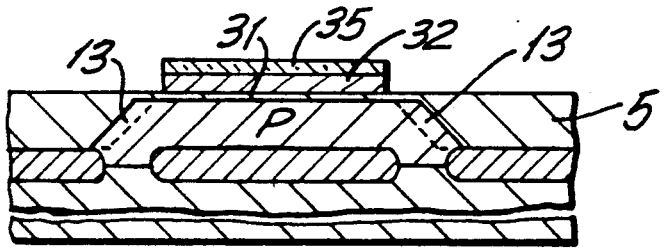
Figure 10:
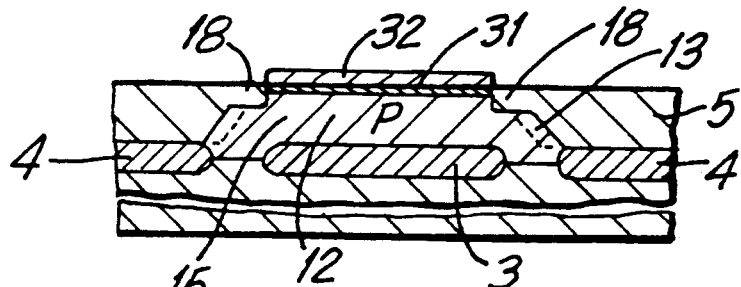

In FIG. 8A, the Y direction is a channel width direction, and the X direction is a channel length direction. FIGS. 3 to 7 mentioned above are cross-sectional views at the channel length direction of N-channel and P-channel IGFET's. FIG. 8B and subsequent FIGS. 9 and 10 are cross-sectional views at the channel width direction of the N-channel IGFET. However, the same process steps are conducted in the P-channel IGFET. Subsequent FIGS. 11 to 14 are cross-sectional views at the channel length direction of the N-channel and P-channel IGFET's.

After the process step shown in FIG. 8, the exposed end sections 32' of the silicon nitride film 32 are etched away by using the photoresist film 35 as a mask (FIG.

Figure 11:
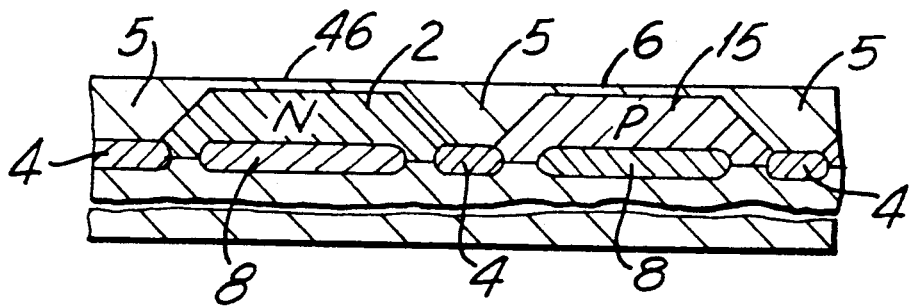
Figure 12:
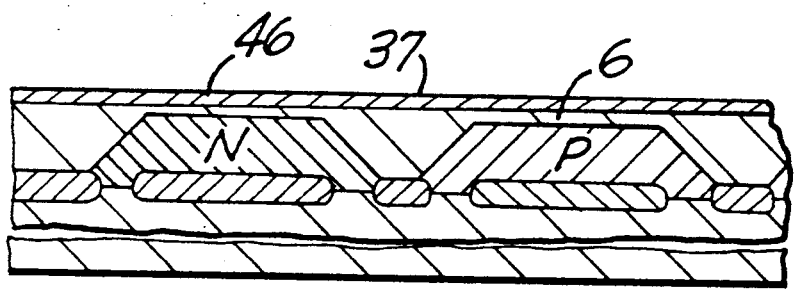
Figure 13:
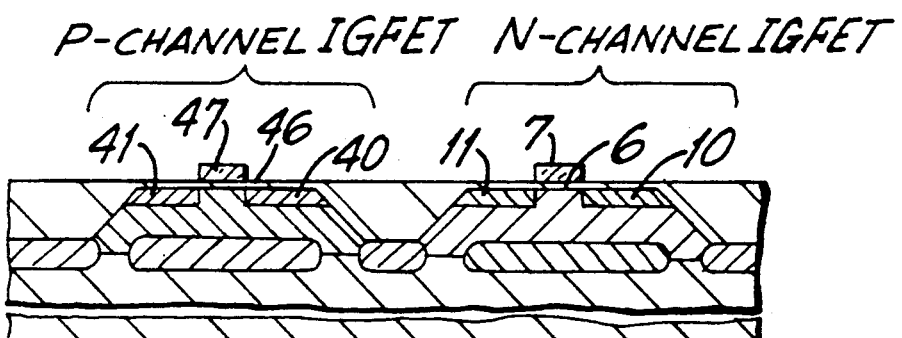
Figure 14:
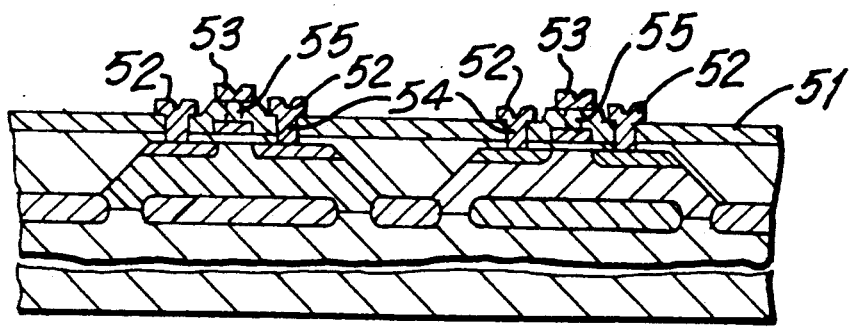

9). Next, after removing the photoresist film 35, the belt-like silicon oxide layers 18 of the present invention are formed by using the remaining silicon nitride films 32 as a mask through an oxidation. The oxidation is conducted under oxidizing atmosphere ($O_2$ or steam) of 5 atm ($5 \times 1.33 \times 10^5$ Pascal) at 950° C. during a short time of 1 hour. Owing to the short heat-treatment time, any unfavorable region same as the region 13 is not newly formed inside the silicon oxide layers 18 by the oxidation (FIG. 10). After removing the silicon nitride films 32 and the thin silicon oxide film 31, a silicon oxide film of 20 nm (200 Å) thickness is newly formed thermally. The film 6, 46 are used as gate insulating films at the parts under the gate electrodes and above the channel regions of the respective IGFET's (FIG. 11). Next, a polycrystalline silicon film 37 doped with phosphorus is deposited (FIG. 12). Next, silicon gate electrodes 7, 47 are formed by patterning the polycrystalline silicon film 37. $N^+$-type source and drain regions 10, 11 are formed by ion implantation of phosphorus through the film 6 by using the gate electrode 7 as a mask, and $P^+$-type source and drain regions 40, 41 are formed by ion implantation of boron through the film 46 by using the gate electrode 47 as a mask (FIG. 13). Next, an inter-ply insulating layer 51 is entirely formed, and aluminum electrode wirings 52 are connected to respective source and drain regions 10, 11, 40, 41 through contact holes 54 provided in the layer 51 and also aluminum electrode wirings 53 are connected to respective gate electrodes 7, 47 through contact holes 55 provided in the layer 51 to constitute a CMOS by the N-channel and P-channel IGFET's (FIG. 14).

By the method mentioned above, the upper surface of the field silicon oxide layer and the upper surface of the transistor forming silicon regions or the surface of the gate insulating films becomd substantially co-planar, that is, keep substantially the same height as each other, and therefore, the electrode wirings can be safely formed without breaking. However, the method necessitates two steps of oxidations (first and second oxidations) having the total time of 4 hours. Therefore, at the end portions of the channel region, boron concentration is unfavorably decreased. When unevenness between the surface of the field silicon oxide layer and that of the transistor forming silicon region is not so important, the field silicon oxide layer may be formed by one oxidation step. That is, in the process step shown in FIG. 5, the silicon oxide layer 33 is grown thicker so as to reach to the $P^+$-type channel stopper region by prolonging the heat treatment time more than 2 hours, and the thicker silicon oxide layer by this process step is used as a field silicon oxide layer as it is. In this case, the problem of reducing boron concentration mentioned above is also produced. However, in view of the deviation and the amount of the reduction of the boron concentration, the problem in the method using two steps of oxidations shown in FIGS. 5 to 7 is more serious than the method using one step of oxidation for forming the field silicon oxide layer.

Figure 15:
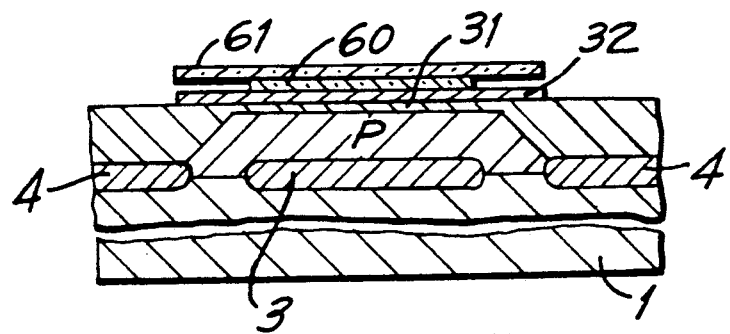
FIG. 15 to FIG. 17 are drawings showing schematically process steps for manufacturing a second embodiment of the present invention.
Figure 16:
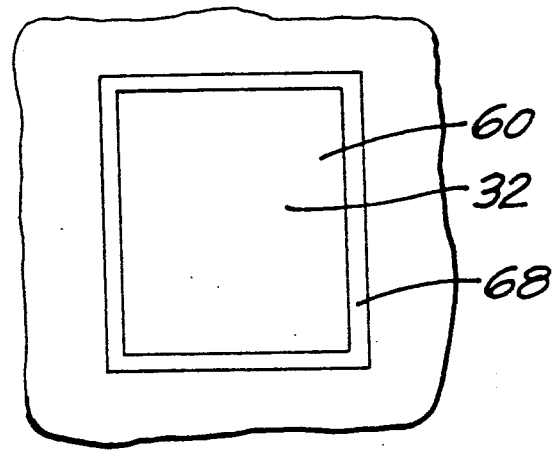
Figure 17:
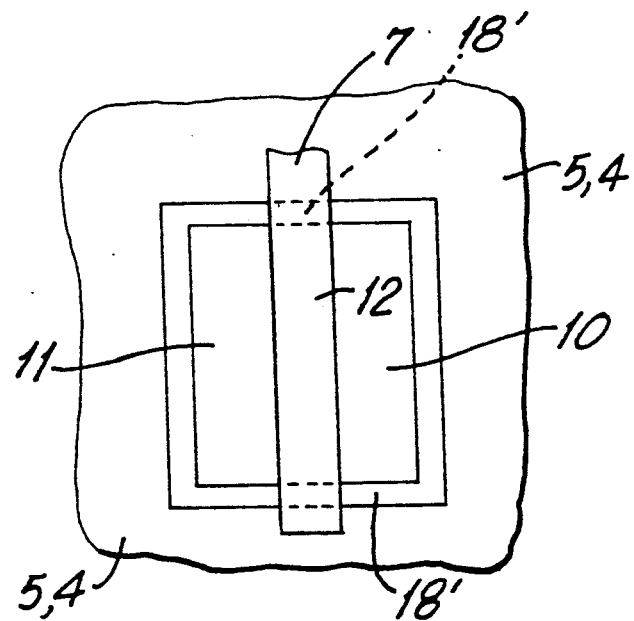

Referring to FIGS. 15 to 17, a method of manufacturing a second embodiment of the present invention will be explained. In FIGS. 15 to 17, the same components as those in drawings on the first embodiment are indicated by the same reference numerals.

A process step shown in FIG. 15 replaces the process step shown in FIG. 8 of the first embodiment. A silicon oxide film of 200 nm (2000 Å) is deposited by a CVD method, and a photoresist film 61 having the same pattern as the silicon nitride film 32 is formed on the CVD silicon oxide film above the silicon nitride film pattern 32. The CVD silicon oxide film is selectively etched away by using the photoresist pattern 61 as a mask. Further, the side etching is conducted on the silicon oxide film to form a reduced silicon oxide film pattern 60. The side etching process is conducted by immersing the substrate into a mixture solution of ammonium fluoride and hydrofluoric acid at a temperature of 22° C. during 4 minutes. Next, the photo resist film 61 is removed to expose a ring plan shaped end section of the silicon nitride film 32. Then, the exposed section of the silicon nitride film 32 is removed by using the reduced silicon oxide film 60 as a mask to exposed, via the thin silicon oxide film 31, a ring-shaped peripheral section 63 of the transistor forming region (FIG. 16). Next, by conducting an oxidation under the same conditions as the formation of the intermediate silicon oxide film 18 of the first embodiment, an intermediate silicon oxide layer 18' of the present invention having a ring plan shape with constant width, surrounding the IGFET including the source and drain regions 10, 11 and the channel region 12 and positioned between the IGFET and the thick field silicon oxide layer 5, is formed at the exposed peripheral section 63 (FIG. 17). The other components and process steps in the second embodiment are the same as in the first embodiment.

What is claimed is:

1. A method of manufacturing an insulated gate field effect transistor which includes source and drain regions and a channel region having a length in a first direction extending between said drain and source regions and a width in a second direction at right angles to said first direction, the method comprising the steps of:

providing a substrate of semiconductor material having a major surface;

covering selectively said major surface of said substrate with a silicon nitride film, thermally growing a first field oxide layer on said substrate under an oxygen or steam atmosphere using said silicon nitride film as mask so that said first field oxide layer is partially embedded in said substrate;

forming a groove in said substrate by etching said first field oxide layer using said silicon nitride film as a mask;

thermally growing a second field oxide layer in said groove, using said silicon nitride film as a mask under an oxygen or steam atmosphere so that a transistor forming region is formed in said substrate, said transistor forming region having a substantially quadrangular shape with first, second, third and fourth straight edge lines, said first and second edge lines being in parallel with each other, and said third and fourth edge lines being in parallel with each other, all edge lines being abutted against said second field oxide layer, respectively;

forming a photoresist film on said silicon nitride film creating end portions along said first and second edge lines of said transistor forming region on said silicon nitride film, said end portions being etched using said photoresist film as a mask;

thermally growing first and second belt-like silicon oxide layers in said transistor forming region extending in said first direction and abutted against said second field oxide layer at said first and second edge lines of said transistor forming region, using the remainder of said silicon nitride film as a mask, said belt-like silicon oxide layers being thinner than said second field oxide layer;

removing said silicon nitride film;

forming a silicon oxide film constituting a gate insulating film over a channel region in said transistor forming region in said substrate between said first and second belt-like silicon oxide layers, said silicon oxide film being thinner than said belt-like silicon oxide layers;

forming a polycrystalline silicon gate electrode on said channel region via said gate insulating film, said gate electrode being in parallel with said third and fourth edge lines of said transistor forming region and extending in said second direction; and forming source and drain regions in said transistor forming region, using said gate electrode as a mask, whereby each of said source and drain regions are abutted against said channel region and said second field oxide layer at said third and fourth edge lines of said transistor forming region in said first direction and against said first and second belt-like silicon oxide layers in said second direction, and said channel region is abutted against said source and drain regions in said first direction and against said first and second belt-like silicon oxide layers in said second direction.

2. A method according to claim 1, wherein said first and second field oxide layers, and said first and second belt-like silicon oxide layers are grown under pressure of about 5 atm.

3. A method according to claim 1, wherein said first and second field oxide layers and said first and second belt-like silicon oxide layers are grown at a temperature of about 950° C.

4. A method according to claim 1, wherein said second field oxide layer has upper and lower portions being substantially co-planar with said transistor forming region.

5. A method according to claim 1, wherein said step of providing said substrate includes the steps of forming $p^+$-type and $n^+$-type regions on an upper surface of a silicon body, and depositing an epitaxial silicon layer on said upper surface causing impurities in said $n^+$-type and $p^+$-type regions to be diffused in an upward direction, whereby selective $p^+$-type regions constitute channel-stopper regions and said $n^+$-type region and remaining $p^+$-type region are situated beneath said transistor forming region as buried layers of CMOS type transistors.

6. A method according to claim 1, wherein said step of providing said substrate further includes the step ofr forming a p-type well in said epitaxial silicon layer by boron implantation.

7. A method according to claim 1, wherein the width in said second direction of said first and second belt-like silicon oxide layers ranges from 0.4 μm to 1.5 μm.

8. A method according to claim 1, wherein said thickness of each said belt-like silicon oxide layers ranges from 200 μm to 600 μm.

* * * * *

UNITED STATES PATENT AND TRADEMARK OFFICE
CERTIFICATE OF CORRECTION

PATENT NO. : 5,081,058
DATED     : January 14, 1992
INVENTOR(S) : MASAKAZU SASAKI It is certified that error appears in the above-identified patent and that said Letters Patent is hereby corrected as shown below:

On the title page, after item [22] insert the following:

[30] Foreign Application Priority Data
December 17, 1987 [JP] Japan ........... 62-320331

Signed and Sealed this

Sixth Day of July, 1993

Attest:

MICHAEL K. KIRK

Attesting Officer

Acting Commissioner of Patents and Trademarks